US006555291B1

(12) United States Patent
Hauck

(10) Patent No.: US 6,555,291 B1
(45) Date of Patent: *Apr. 29, 2003

(54) THERMAL DIGITAL LITHOGRAPHIC PRINTING PLATE

(75) Inventor: Celin S. Hauck, Badenhausen (DE)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 80 days.

This patent is subject to a terminal disclaimer.

(21) Appl. No.: 09/638,556

(22) Filed: Aug. 14, 2000

(51) Int. Cl.[7] .................................................. G03F 7/09

(52) U.S. Cl. ................. 430/302; 430/270.1; 430/271.1; 430/273.1; 430/281.1; 430/283.1; 430/286.1; 430/348; 430/944; 430/945; 101/453; 101/463.1; 101/465

(58) Field of Search ........................... 430/270.1, 271.1, 430/273.1, 281.1, 286.1, 302, 348, 944, 945, 964, 283.1; 101/453, 463.1, 465

(56) References Cited

U.S. PATENT DOCUMENTS

| | | | | |
|---|---|---|---|---|
| 4,665,124 A | | 5/1987 | Walls et al. | 525/61 |
| 4,687,727 A | | 8/1987 | Toyama et al. | 430/175 |
| 5,112,743 A | | 5/1992 | Kamiya et al. | 430/175 |
| 5,141,838 A | | 8/1992 | Aoshima et al. | 430/191 |
| 5,700,619 A | | 12/1997 | Baumann et al. | 430/175 |
| 5,705,308 A | | 1/1998 | West et al. | 430/165 |
| 5,705,322 A | | 1/1998 | West et al. | 430/325 |
| 5,731,127 A | | 3/1998 | Ishizuka et al. | 430/270.1 |
| 6,060,217 A | | 5/2000 | Nguyen et al. | 430/302 |
| 6,083,663 A | | 7/2000 | Vermeersch et al. | 430/302 |
| 6,090,532 A | | 7/2000 | West et al. | 430/326 |
| 6,152,036 A | | 11/2000 | Vermeersch et al. | 101/457 |
| 6,280,899 B1 | * | 8/2001 | Parsons et al. | 430/270.1 |
| 6,294,311 B1 | * | 9/2001 | Shimazu et al. | 430/271.1 |
| 6,342,336 B2 | * | 1/2002 | Verschueren et al. | 430/271.1 |
| 6,352,811 B1 | * | 3/2002 | Patel et al. | 430/270.1 |
| 6,352,812 B1 | * | 3/2002 | Shimazu et al. | 430/273.1 |
| 6,358,669 B1 | * | 3/2002 | Savariar-Hauck et al. | 430/273.1 |
| 2001/0044065 A1 | * | 11/2001 | Hauck et al. | 430/166 |

FOREIGN PATENT DOCUMENTS

| | | | | |
|---|---|---|---|---|
| EP | 0 823 327 A2 | | 2/1998 | |
| EP | 0 864 420 A1 | | 9/1998 | |
| EP | 0 909 657 A2 | | 4/1999 | |
| EP | 0 950 513 A1 | | 10/1999 | |
| EP | 1 023 994 A1 | | 8/2000 | |
| JP | 9-43847 | | 2/1997 | |
| WO | 96/20429 | | 7/1996 | |
| WO | 97/07986 | | 3/1997 | |
| WO | 97/39894 | | 10/1997 | |
| WO | 98/42507 | | 10/1998 | |
| WO | 99/11458 | | 3/1999 | |
| WO | WO 99/67097 | * | 12/1999 | |
| WO | WO 01/45958 A2 | * | 6/2001 | B41M/5/00 |
| WO | WO 01/96119 A1 | * | 12/2001 | B41C/1/10 |
| WO | WO 02/14071 A1 | * | 2/2002 | B41C/1/10 |

* cited by examiner

*Primary Examiner*—Janet Baxter
*Assistant Examiner*—Barbara Gilliam
(74) *Attorney, Agent, or Firm*—RatnerPrestia

(57) ABSTRACT

Thermally imageable elements useful as lithographic printing plates, and methods for forming an image using the thermally imageable elements are disclosed. The element contains a support with a hydrophilic surface, an underlayer over the hydrophilic surface, and a top layer over the underlayer. The top layer contains a polymeric material, such as a novolac resin, a resol resin, or a mixture thereof, but does not require a compound that functions as a solubility-suppressing component for the polymeric material. Consequently, the top layer is free of materials that function as solubility-suppressing components for the polymeric material. In one embodiment, the element, preferably the underlayer, absorbs infrared radiation. Following thermal exposure, the element is developed with an aqueous alkaline developer having a pH of at least 7 to about 11, typically about 10.

38 Claims, No Drawings

THERMAL DIGITAL LITHOGRAPHIC PRINTING PLATE

FIELD OF THE INVENTION

The invention relates lithographic printing. More particularly, this invention relates to thermally imageable elements useful as lithographic printing plates and to a method for forming an image using a thermally imageable element.

BACKGROUND OF THE INVENTION

In lithographic printing, ink receptive areas, known as image areas, are generated on a hydrophilic surface. When the surface is moistened with water and ink is applied, the hydrophilic regions retain the water and repel the ink, and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plate precursors typically comprise a radiation-sensitive coating applied over the hydrophilic surface of a support. If after exposure to radiation the exposed regions of the coating become soluble or dispersible and are removed in the developing process revealing the underlying hydrophilic surface of the support, the plate is called a positive-working printing plate. Conversely, if the exposed regions of the plate become insoluble in the developer, and the unexposed regions are removed by the developing process, the plate is called a negative-working plate. In each instance, the regions of the radiation-sensitive layer (i.e., the image areas) that remain are ink-receptive and the regions of the hydrophilic surface revealed by the developing process accept water, typically a fountain solution, and repel ink.

Direct digital imaging of lithographic printing plate precursors, which obviates the need for exposure through a negative, is becoming increasingly important in the printing industry. Thermally imageable systems have been developed in which it has been suggested that a thermally frangible complex is formed between a polymeric material and a solubility-suppressing component that reversibly suppresses the solubility of the polymeric material in the developer. After imagewise thermal exposure, the rate of removal of the exposed regions by the developer is greater that the rate of removal of the unexposed regions so that the exposed regions are removed by the developer to form an image. Such systems are disclosed in, for example, Parsons, WO 97/39894 and U.S. Pat. No. 6,280,899; Nagasaka, EP 0 823 327; Miyake, EP 0 909 627; West, WO 98/42507 and U.S. Pat. No. 6,090,532; and Nguyen, WO 99/11458, and U.S. Pat. No. 6,060,217. However, in these systems it is necessary to use a solubility-suppressing component for the polymeric material in the top. Thus, a need exists for an improved thermally imageable element, useful as a lithographic printing member, that does not suffer from this disadvantage.

SUMMARY OF THE INVENTION

In one embodiment, the invention is a method for forming an image using a thermally imageable element comprising a top layer that does not comprise a compound that acts as a solubility-suppressing component. The method comprises the steps of:

a) thermally imaging the thermally imageable element and producing exposed and unexposed regions in the thermally imageable element; and b) developing the thermally imageable element with an aqueous alkaline developer and removing the exposed regions;

in which:

- the thermally imageable element comprises, in order:
  - a top layer;
  - an underlayer; and
  - a hydrophilic substrate;
- the underlayer comprises a first polymeric material;
- the top layer comprises a second polymeric material;
- the second polymeric material is removable by the aqueous alkaline developer;
- the top layer is free of materials that function as a solubility-suppressing component for the second polymeric material;
- the top layer is ink-receptive; and
- the aqueous alkaline developer has a pH of at least 7 to about 11.

In another embodiment, the invention is a thermally imageable element. In still another embodiment, the invention is a method of printing using an imaged and developed thermally imageable element.

The top layer does not require a compound that functions as a solubility-suppressing component for the second polymeric material. Consequently, the top layer is free of materials that function as a solubility-suppressing component for the second polymeric material. Typically, the aqueous alkaline developer has a pH of about 10. In one embodiment, the top layer consists essentially of the second polymeric material. In a preferred embodiment, the second polymeric material is a phenolic resin or a sulphonanide resin, more preferably a novolac resin or a resole resin.

DETAILED DESCRIPTION OF THE INVENTION

The thermally imageable element (sometimes referred to as a precursor for a lithographic printing plate or a lithographic printing member) comprises a substrate with a hydrophilic surface, an underlayer comprising a first polymeric material, and an ink-receptive top layer comprising a second polymeric material. The underlayer is over the hydrophilic surface, and the top layer over the underlayer. The top layer does not comprise a solubility inhibitor for the second polymeric material. Although other layers, such as radiation absorbing layers may be present, typically no other layers are present. The thermally imageable element is thermally exposed and developed with an aqueous alkaline developer having a pH between 7 and 11 to remove the exposed regions without removing the unexposed regions. The imaged element is useful as a lithographic printing plate or a lithographic printing member.

Hydrophilic Substrate

The hydrophilic substrate, i.e., the substrate that comprises at least one hydrophilic surface, comprises a support, which may be any material conventionally used to prepare lithographic printing plates. The support is preferably strong, stable and flexible. It should resist dimensional change under conditions of use so that color records will register in a full-color image. Typically, it can be any self-supporting material, including polymeric films, ceramics, metals, or stiff papers, or a lamination of any of these materials. Paper supports are typically "saturated" with polymerics to impart water resistance, dimensional stability and strength.

Metal supports include aluminum, zinc, titanium, and alloys thereof. A preferred metal support is an aluminum sheet. The surface of the aluminum sheet may be treated by techniques known in the art, including physical graining, electrochemical graining, chemical graining, and anodizing, and then conditioned by chemical means, for example by treatment with water, a solution of phosphate or silicate salt, or a polycarboxylic acid to produce the hydrophilic surface.

If the surface is roughened, the average roughness Ra is preferably in the range 0.1 μm to 0.8 μm. Roughened substrates in which the surface has a surface roughness of 0.1 μm to 2 μm are disclosed in Bhambra, WO97/19819 (PCT/GB96/02883); Bhambra, WO98/52769 (PCT/GB98/01500); and Bhambra, WO98/52768 (PCT/GB/98/01496). In these substrates the support is coated with a hydrophilic layer that comprises a mixture of two particulate materials, preferably alumina and titanium dioxide. The mean particle size of the alumina particles is preferably in the range of 1 μm to 5 μm; the mean particle size of the titanium dioxide particles is preferably in the range of 0.1 μm to 0.5 μm.

Useful polymeric films include polyester films (such as MYLAR® polyethylene terephthalate film sold by E. I. du Pont de Nemours and Co., Wilmington, Del., and polyethylene naphthanate). A preferred polymeric film is polyethylene terephthalate.

The substrate may consist only of the support, or it may additionally comprise one or more optional subbing and/or adhesion layers. Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, aminopropyltrimethoxysilane, glycidoxypropyltriethoxysilane and epoxy functional polymers, as well as conventional subbing materials used on polyester bases in photographic films.

The back side of the substrate (i.e., the side opposite the hydrophilic surface, the underlayer and top layer) may be coated with an antistatic agent and/or a slipping layer or matte layer to improve handling and "feel" of the imageable element.

The support should be dimensionally stable and of sufficient thickness to sustain the wear from printing and be thin enough to wrap around a printing form. Polyethylene terephthalate or polyethylene naphthanate typically has a thickness of from about 100 μm to about 310 μm, preferably about 175 μm. Aluminum sheet typically has a thickness of from about 100 to about 600 μm.

Underlayer

The underlayer, or first layer, is over the hydrophilic surface of the hydrophilic substrate. After imaging, it is removed in the imaged regions along with the top layer by the aqueous alkaline developer to expose the underlying hydrophilic surface of the substrate. It is preferably soluble in the aqueous alkaline developer to prevent sludging of the developer. Preferably it is soluble in a wholly aqueous developer, i.e. one that does not include added organic solvents.

The underlayer comprises a first polymeric material. The first polymeric material preferably is soluble in an aqueous alkaline developer. In addition, the first polymeric material should be insoluble in the solvent used to coat the top layer so that the top layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Solvent Resistant Underlayers

Solvent resistant underlayers are disclosed in Shimazu, U.S. Pat. No. 6,294,311, the disclosure of which is incorporated herein by reference. Particularly useful polymeric materials are copolymers that comprise N-substituted maleimides, especially N-phenylmaleimide; polyvinylacetals; methacrylamides, especially methacylamide; and acrylic and/or methacrylic acid, especially methacrylic acid. More preferably two functional groups are present in the polymeric material, and most preferably all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some of all of the methacrylamide. Other aqueous alkaline soluble monomers, such as acrylic acid, may be used in place of some or all of the methacrylic acid.

These polymeric materials are soluble in aqueous alkaline developers. In addition they are soluble in methyl lactate/methanol/dioxolane (15:42.5:42.5 wt %) mixture, which can be used as the coating solvent for the underlayer. However, they are poorly soluble in solvents such as acetone, isopropyl alcohol, butyl acetate, and butanol, which can be used as solvents to coat the top layer over the underlayer without dissolving the underlayer. These polymeric materials are typically resistant to washes with 80 wt % diacetone alcohol/20 wt % water.

Another group of preferred polymeric materials for the first polymeric material are aqueous alkaline developer soluble copolymers that comprise a monomer that has a urea bond in its side chain (i.e., a pendent urea group), such are disclosed in Ishizuka, U.S. Pat. No. 5,731,127, incorporated herein by reference. These copolymers comprise about 10 to 80 wt %, preferably about 20 to 80 wt %, of one of more monomers represented by the general formula:

$$CH_2{=}C(R){-}CO_2{-}X{-}NH{-}CO{-}NH{-}Y{-}Z$$

in which

R is —H or —$CH_3$; X is a bivalent linking group; Y is a substituted or unsubstituted bivalent aromatic group; and Z is —OH, —COOH, or —$SO_2NH_2$.

R is preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is $-(CH_2CH_2)-$. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or $-SO_2NH_2$, preferably —OH. A preferred monomer is:

$$CH_2{=}C(CH_3){-}CO_2{-}CH_2CH_2{-}NH{-}CO{-}NH\text{-}p\text{-}C_6H_4{-}Z$$

in which Z is —OH, —COOH, or $-SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in aqueous alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzene-sulfonamide, or p-aminophenol, followed by ring closure by acid.

Another group of polymeric materials that are useful in the underlayer include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838, incorporated herein by reference. Particularly useful polymeric materials comprise (1) the sulfonamide monomer unit, especially N-(p-aminosulfonylphenyl) methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the first polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about1.5 $g/m^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacylamide; and acrylic and/or methacrylic acid, especially methacrylic acid (2) with an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl)-methacrylamide N-(o-aminosulfonylphenyl) methacrylamide, and/or the corresponding acrylamide, is especially advantageous. One or more other polymeric materials, such a phenolic resin, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight the first and second polymeric materials in the underlayer. The first and second polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

Negative-Working, Base Soluble Photosensitive Compositions

The underlayer may comprise a negative-working, base soluble photosensitive composition. Such compositions are often referred to as "photohardenable compositions" or "photoinsolubilizable compositions" because they become developer insoluble on irradiation. Typically these compositions comprise materials that undergo photocrosslinking, photodimerization, and/or photopolymerization on exposure to actinic radiation, typically ultraviolet light. Photohardenable compositions produce printing plates with high press life and resistance to press room chemicals. Negative working systems are discussed, for example, in Chapter 2 of *Photoreactive Polymers: the Science and Technology of Resists,* A. Reiser, Wiley, New York, 1989, pp. 22–64.

The underlayer may comprise a negative-working diazonium-containing composition. Typically the diazonium containing compound is a diazonium polycondensation product. Diazonium polycondensation products well known to these skilled in the art. They may be prepared, for example, by condensation of a diazo monomer, such as is described in Toyama, U.S. Pat. No. 4,687,727 with a condensation agent, such as formaldehyde, acetaldehyde, propionaldehyde, butyraldehyde, isobutyraldehyde or benzaldehyde. Furthermore, mixed condensation products are used which, apart from the diazonium salt units, comprise other non-photosensitive units which are derived from condensable compounds, in particular from aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetratluoroborate, hexafluorophosphate, hexafluoroantimonate and hexafluoroaresenate are particularly suitable as anions of these diazo resins. The diazonium polycondensation product is preferably present in the photosensitive mixtures in an amount of from 3 to 60 wt %.

Numerous binders are known. One such system is described in Baumann, U.S. Pat. No. 5,700.619, the disclosure of which is incorporated herein by reference. The binder is an acetalized polyvinyl alcohol, with pendent carboxyl groups.

The underlayer may comprise a photopolymerizable composition. Preferred photosensitive compositions are photopolymerizable compositions, which comprise one of monomers, one or more binders, and one or more photoinitiator systems. Other components conventionally added to photopolymerizable compositions can be present to modify the physical properties of the film. Such components include: for example, plasticizers, thermal stabilizers, adhesion modifiers, coating aids, and release agents. Nonionic surfactants, for example, may be added to the photopolymerizable composition as coating aids. Such systems are well known in art, and are discussed, for example, in *Photopolymers: Radiation Curable Imaging Systems,* B. M. Monroe, in *Radiation Curing: Science and Technology,* S. P. Pappas, Ed., Plenum, New York, 1992, pp. 399–440.

Photopolymerizable compositions comprise at least one ethylenically unsaturated compound that undergoes free-radical initiated polymerization, generally known as a monomer. The monomers are typically multifunctional, i.e., they comprise more than one ethylenically unsaturated, free radical polymerizable group. Typical multifunctional monomers are unsaturated esters of alcohols, preferably acrylate and methacrylate esters of polyols, such as, trimethylolpropane triacrylate and trimethacrylate, pentaerythritol triacrylate and trimethacrylate, pentaerythritol tetraacrylate and tetramethacrylate, ethoxylated-trimethylolpropane triacrylate and trimethacrylate, glycerolpropoxy triacrylate and trimethacrylate, ethyleneglycol diacrylate and dimethacrylate, tripropyleneglycol diacrylate and dimethacrylate, and tetraethyleneglycol diacrylate and dimethacrylate. Oligomers and/or prepolymers, such as urethane acrylate and methacrylate, epoxide acrylate and methacrylate, polyester acrylate and methacrylate, polyether acrylate and methacrylate or unsaturated polyester resins, may also be used. Numerous other unsaturated monomers polymerizable by free-radical initiated polymerization and useful in photopolymerizable compositions are known to those skilled in the art.

The composition comprises at least one preformed macromolecular polymeric material, generally know as a binder. In general, the binder should be swellable or, preferably, soluble in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid. Numerous other binders useful in photopolymerizable compositions are known to those skilled in the art.

When the material is to be cured by irradiation with ultraviolet or visible radiation, a free radical generating, initiating system activatable by ultraviolet or visible radiation, known as a photoinitiating system, may be present to facilitate polymerization of the polymerizable monomers. The photoinitiator system absorbs in ultraviolet and/or visible regions of the spectrum, i.e., in the range of from 300 to 800 nm, preferably in the ultraviolet, i.e. 300 nm to 400 nm.

The photoinitiating system may be a single compound or a mixture of compounds. Suitable photoinitiating systems are disclosed in "Photoinitiators for Free-Radical-Initiated Photoimaging Systems," by B. M. Monroe and G. C. Weed, *Chem. Rev.,* 93, 435–448 (1993) and in "Free Radical Polymerization" by K. K. Dietliker, in *Chemistry and Technology of UV and EB Formulation for Coatings, Inks, and Paints,* P. K. T. Oldring, ed, SITA Technology Ltd., London, 1991, Vol. 3, pp. 59–525. Typical free radical photoinitiating compounds include benzophenone; 2-hydroxy-2-methyl-1-phenylpropan-1-one (Darocur® 1173); 2,4,6-trimethylbenzolyl-diphenyl-phosphine oxide (Lucerin® TPO); 2-isopropylthioxanthone; 2-chlorothioxanthone; 2,2-dimethoxy-2-phenyl-acetophenone (benzildimethyl ketal, BDK, Irgacure® 651, Lucerin® BDK); 2-methyl-1-[4-(methylthio)phenyl]-2-morpholinopropanone-1 (Irgacure® 907); 1-hydroxycyclohexylphenyl ketone (HCPK, Irgacure® 184); bis(2,6-dimethoxybenzolyl)-2,4,4-trimethylpentylphosphine oxide; and combinations thereof. Mixed photoinitiators include a 50:50 mixture of 2-hydroxy-2-methyl-1-phenylpropan-1-one and 2,4,6-trimethylbenzolyl-diphenylphosphine oxide (Darocur® 4265); and a 25:75 mixture of bis(2,6-dimethoxybenzolyl)-2,4,4-trimethylpentyl-phosphine oxide and 2-hydroxy-2-methyl-1-phenylpropan-1-one (CGI 1700).

A hybrid system comprising a combination of a diazonium polycondensation product and a free polymerizable system may be advantageous for certain applications. The compositions of such hybrid systems preferably comprise 1 to 50% diazonium polycondensation products, 0.5 to 20% photoinitiators as well as 5 to 80% free radical polymerizable components.

Photocrosslinkable systems typically comprise at least one binder and a photoactivated at least bifunctional crosslinking agent that crosslinks the binder on irradiation. Organic azides, which are believed to form nitrenes on irradiation, have been used to crosslink binders. Diazido compounds, such as the disulfonated derivative of 4,4'-diazidostilbene, are preferred azides for photocrosslinking.

Photodimerizable systems comprise a binder that forms a crosslink on irradiation. Photocrosslinkble binders include, for example, the polyvinyl alcohols functionalized with cinnamate groups, such as are described in Minsk, U.S. Pat. Nos. 2,690,966, and 2,725,372, or with N-alkyl styrylpyridinium or N-alkyl styrylquinoliwium groups, such as are described in, for example, Ichimura, U.S. Pat. Nos. 4,272,620; 4,287,335; 4,339,524; 4,564,580; and 4,777,114. Other photocrosslinkable systems are described in, for example, in Osada, U.S. Pat. No. 3,804,628, and Aoshima, U.S. Pat. No. 5,240,808.

Photothermal Conversion Material

When the thermally imageable element is to be imaged by exposure with infrared radiation, the element preferably absorbs radiation in the range of about 800 nm to 1200 nm, the range of radiation commonly used for imaging thermally imageable elements. Typically, an absorber, sometimes referred to as "a photothermal conversion material" is present in the underlayer, the top layer, and/or a separate absorbing layer. When an absorbing layer is present, it is typically located between the top layer and the underlayer. When the photothermal conversion material is present in the top layer, it can not be a material that acts as a solubility-suppressing component. The photothermal conversion material is preferably located in the underlayer. The top layer is preferably free of photothermal conversion materials, i.e., the top layer is preferably substantially free of photothermal conversion materials.

Photothermal conversion materials absorb radiation and convert it to heat. Photothermal conversion materials may absorb ultraviolet, visible, and/or infrared radiation and convert it to heat. Although the first polymeric material may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrilium or metal diothiolene class. Examples of absorbing pigments are Projet 900, Projet 860 and Projet 830 (all available from the Zeneca Corporation). Carbon black pigments may also be used. Because of their wide absorption bands, carbon black-based plates can be used with multiple infrared imaging devices having a wide range of peak emission wavelengths.

Dyes, especially dyes with a high extinction coefficient in the range of 750 nm to 1200 nm, are preferred. The dye may be chosen, for example, from indoaniline dyes, oxonol dyes, porphyrin derivatives, anthraquinone dyes, merostyryl dyes, pyrylium compounds and sqarylium derivatives. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618, all of which are incorporated herein by reference. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and Trump IR Dye (Eastman Kodak, Rochester, N.Y.).

The amount of imaging radiation absorber in the underlayer is generally sufficient to provide an optical density of at least 0.05, and preferably, an optical density of from about 0.5 to about 2 at the imaging wavelength. As is well known to those skilled in the art, the amount of absorber required to produce a particular optical density can be determined from the thickness of the underlayer and the extinction coefficient of the absorber at the wavelength used for imaging using Beers law. Typically the underlayer comprises at least about 0.1 wt % of imaging radiation absorber, and preferably from about 1 to about 30 wt % of absorber.

Top Layer

The top layer comprises a second polymeric material. The top layer is releasable from the underlayer on thermal exposure. Though not being bound by any theory or explanation, it is believed that thermal exposure causes the top layer to more readily dissolve or disperse in the aqueous developer and/or weakens the bond between the top layer and the underlayer, allowing the developer to penetrate the top layer and dissolve the underlayer in the exposed regions. Typically, the second polymeric material is insoluble in the aqueous alkaline developer. It is removed and dispersed in the developer when the developer penetrates the top layer in the exposed regions and dissolves or disperses the underlayer in these regions.

Typically, the second polymeric material comprises phenolic hydroxyl groups or an active imide (NH) group. Polymeric materials that comprise an active imide group include, for example, polymeric materials that that contain a substituted sulphonamide group (such as $—SO_2NHCOR$, $—SO_2NHSO_2NR$, and $—CONHSO_2NR$), and polymeric materials that comprise a —CONHCO— group.

Polymers that contain phenolic hydroxyl groups, i.e., phenolic resins, are preferred. Preferably the polymeric material is a light-stable, water-insoluble, aqueous alkaline developer-soluble, film-forming polymeric material that has a multiplicity of phenolic hydroxyl groups, either on the polymer backbone or on pendant groups. Novolac resins, resol resins, acrylic resins that contain pendent phenol groups, and polyvinyl phenol resins are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other useful phenolic resins include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

Unlike other thermally imageable systems, the top layer does not require a compound that functions as a solubility-suppressing component for the second polymeric material. Consequently, the top layer is free of materials that function as a solubility-suppressing component for the second polymeric material. Solubility suppressing components are disclosed, for example, in West, U.S. Pat. No. 5,705,308; Bennett, WO97/07986 [PCT/GB96/01973], Nagasaka, EP 0,823,327, and West, U.S. Pat. No. 6.060,222, as well as in U.S. patent application Ser. No. 09/592,895, filed Jun. 13, 2000, the disclosure of which is incorporated herein by reference. Solubility-suppressing components have polar functional groups that are believed to act as acceptor sites for hydrogen bonding with the hydroxyl groups present in the second polymeric material. The acceptor sites comprise atoms with high electron density, typically selected from electronegative first row elements, especially carbon, nitrogen, and oxygen.

Typical polar groups include diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Other compounds that have been proposed include: compounds containing other polar groups, such as ether, amine, azo, nitro, ferrocenium, sulfoxide, sulfone, and disulfone; monomeric or polymeric acetals having recurring acetal or ketal groups; monomeric or polymeric ortho carboxylic acid esters having at least one ortho carboxylic acid ester or amide group; enol ethers; N-acyliminocarbonates; cyclic acetals or ketals; β-ketoesters or β-ketoamides; and compounds that contain aromatic groups, such as phenyl, substituted phenyl such as p-methylphenyl, and naphthyl. Typical solubility-suppressing components include compounds that contain a diazo group, such as compounds that contain the o-diazonaphthoquinone moiety (i.e., quinonediazides). Polymeric diazonaphthoquinone compounds include phenolic resins, such as novolac resins and resole resins, derivatized with an o-diazonaphthoquinone moiety. Compounds that contain a positively charged (i.e., quaternized) nitrogen atom useful as dissolution inhibitor compounds include, for example, tetraalkyl ammonium compounds, quinolinium compounds, benzothiazolium compounds, pyridinium compounds, and imidazolium compounds. Representative triarylmethane dyes dissolution inhibitor compounds include ethyl violet, crystal violet, malachite green, brilliant green, Victoria blue B, Victoria blue R, and Victoria pure blue BO. Quaternized heterocyclic compounds are useful as dissolution inhibitors. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzotniazolium compounds include 3-ethyl-2(3H)-benzothiazolylidene)-2-methyl-1-(propenyl)benzothiazolium cationic dyes and 3-ethyl-2-methyl benzothiazolium iodide. Suitable pyridinium dissolution inhibitor compounds include cetyl pyridinium bromide and ethyl viologen dications. Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenyl amine and triphenyl amine. Keto containing compounds useful as dissolution inhibitor compounds include, for example, aldehydes; ketones, especially aromatic ketones; and carboxylic acid esters.

The top layer does not contain a derivatized phenolic polymer that functions as a solubility-suppressing component. When the second polymeric material is a phenolic polymer, some of the hydroxyl groups have been derivatized to introduce other polar groups so that the derivitized second polymeric material acts as a solubility-suppressing component. Derivatives can include, for example, carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

The top layer may comprise particulate material, provided the particulate material does not function as a solubility-suppressing component. The dye or pigment may absorb infrared radiation, aid in visual inspection on the exposed and/or developed element, or improve both the scratch resistance and presslife of the exposed and developed element. Typically, the particles have an average diameter about 0.5 μm and about 10 μm. Organic and/or inorganic particulate material may be used. Examples of organic particles are crosslinked polystyrene beads and polymethyl methacrylate beads. Non-crosslinked polymers such as polycarbonate and acrylonitrile-butadiene copolymers, which form particles in situ during the drying process, are also useful in improving presslife of the exposed and developed elements. Inorganic particles include, for example, silica and alumina particles. The amounts of particles used can range from 0.5% to 30% of the coating weight of the layer, preferably is 5% to 15%.

Preparation of the Thermally Imageable Element

The thermally imageable element may be prepared by sequentially applying the underlayer over the hydrophilic surface of the hydrophilic substrate, and then applying the top layer over the underlayer using conventional coating, extrusion, or lamination methods. However, it is important to avoid intermixing the underlayer and top layer.

The underlayer may be applied over the hydrophilic substrate by any conventional method. Typically the ingredients are dispersed or dissolved in a suitable coating solvent, and the resulting mixture coated by conventional methods, such as spin coating, bar coating, gravure coating, or roller coating. The top layer, or second layer, may be applied over the underlayer, typically to the surface of the underlayer by any conventional method, such as those listed above. The term "solvent" includes mixtures of solvents, especially mixtures of organic solvents.

Selection of the solvents used to coat the underlayer and to coat the top layer will depend on the nature of the first polymeric material, the second polymeric material, and the other ingredients present in the layers. To prevent the underlayer from dissolving and mixing with the top layer when the top layer is coated over the underlayer, the top layer should be coated from a solvent in which the first polymeric material is essentially insoluble. Thus, the coating solvent for the top layer should be a solvent in which the second polymeric material is sufficiently soluble that the top layer can be formed and in which the first polymeric material is essentially insoluble. Although the solvents used depend on the nature of the polymeric materials, typically the first polymeric material will be soluble in more polar solvents and insoluble in less polar solvents so that the solvent used to coat the underlayer is more polar than the solvent used to coat the top layer. Consequently, the top layer can typically be coated from a conventional organic solvent such as toluene, 2-butanone, propyleneglycol acetate, n-butanol, iso-propyl alcohol, or butyl acetate. An intermediate drying step, i.e., drying the underlayer to remove coating solvent before coating the top layer over it, may also be used to help prevent mixing of the layers.

The top layer may be coated as an aqueous dispersion to avoid dissolving the underlayer during the coating process. Alternatively, the underlayer, the top layer or both layers may be applied by conventional extrusion coating methods from a melt mixture of layer components. Typically, such a melt mixture contains no volatile organic solvents. Consequently, possible intermixing of the layers caused by a coating solvent is not a problem when extrusion or lamination is used to prepare the element.

Image Formation

Imaging of the imageable element produces an imaged element, which comprises a latent image of imaged and unimaged regions. Developing the exposed element to form a developed element converts the latent image to an image by removing the exposed regions of the top layer and the underlayer, and exposing the hydrophilic surface of the underlying substrate. The element is positive working, in that the underlayer and top layers are removed in the exposed regions when developed with the aqueous developer. The exposed regions become the non-ink accepting regions.

While not being bound by any theory or explanation, it is believed that thermal exposure changes the adhesion of the top layer to the bottom layer in the exposed regions. After the element is heated by imagewise thermal exposure, the developer can penetrate the exposed regions of the top layer much more rapidly than it penetrates the unexposed regions. The underlying regions of the underlayer are removed along with the exposed regions of the top layer, revealing the underlying hydrophilic surface of the substrate.

The thermally imageable element may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1064 nm. Suitable commercially available imaging devices include image setters such as a Creo Trendsetter (available from the CREO Corp., British Columbia, Canada) and a Gerber Crescent 42T (available from the Gerber Corporation).

Alternatively, the thermally imageable element may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the element absorb infrared radiation. However, elements that absorb infrared radiation can be imaged with a thermal head.

The developer may be any liquid or solution that can penetrate and remove the exposed regions of the top layer and the underlying regions of the underlayer without substantially affecting the complimentary unexposed regions. While not being bound by any theory or explanation, it is believed that image discrimination in these systems is based on a kinetic effect. The exposed regions of the top layer are removed more rapidly in the developer than the unexposed regions. Development is carried for a long enough time to remove the exposed regions of the top layer and the underlying regions of the underlayer in the developer, but not long enough to remove the unexposed regions of the top layer. Hence the exposed regions are described as being "soluble" in the developer because they are removed, and dissolved and/or dispersed, more rapidly in the developer than the unexposed regions. Typically, the underlayer is dissolved in the developer, and the top layer is dispersed in the developer.

Useful developers are aqueous alkaline solutions having a pH of at least 7 to about 11. Preferred aqueous alkaline developers have a pH about 8 to about 10.5, more preferably about 9 to 10, even more preferably about 10. Developers with a pH in the range of 13 or higher cannot be used. Preferred developers are aqueous developers, i.e., those that either do not comprise an added organic solvent or to which only a small amount of organic solvent, typically about 10 wt % or less, preferably about 6 wt % of less, has been added.

To prevent formation of sludge on the element during the development process, a developer that comprises an organic dispersing agent of mixture of agents, such as HYDROPALAT® 1080 dispersing agent (Henkel), HYDROPALAT® 3204 dispersing agent (Henkel), or Sequion MS 84 dispersing agent (Polygon Chemie), can be used. Typically, about 1–5 weight % of dispersing agent or agents is present in the developer. The dispersing agent forms a stable dispersion with the phenolic component or components of the top layer. The developer may also comprise: a small amount (i.e., about 1 to 10 wt %, preferably about 1 to 6 wt %) of an organic solvent, such as ethylene glycol monophenyl ether, diethylene glycol monophenyl ether, tetraethylene glycol monophenyl ether, or benzyl alcohol; a wetting agent, such as sodium octyl sulfate or an alkali naphthalene sulfonate; and a buffer system to maintain the pH of the developer. The dispersing agent keeps the dispersible components of the top layer in finely dispersed form and prevents their redeposition on the exposed and developed element and on the rollers and the processor.

Typically the developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced.

The developed element, typically a lithographic printing plate or printing member, comprises (1) regions in which the underlayer and top layer have been removed revealing the underlying surface of the hydrophilic substrate, and (2) complimentary regions in which the underlayer and top layer have not been removed. The regions in which both the underlayer and top layer have not been removed are ink receptive and correspond to the regions that were not exposed during imaging.

If desired, a post-development baking step can be used to increase the run length of the plate. Baking can be carried out, for example, at about 220° C. to about 240° C. for about 7 to 10 minutes.

If the underlayer comprises a negative-working, base soluble photosensitive composition, the developed element is exposed to actinic radiation. Any convenient source or sources of actinic radiation providing wavelengths in the region of the spectrum that overlap the absorption bands of the photosensitive composition can be used to activate photoinsolubilization. By "actinic radiation" is meant any radiation that can induce photoinsolubilization in the underlayer. The radiation can be natural or artificial, monochromatic or polychromatic, incoherent or coherent. Conventional light sources include fluorescent lamps, mercury lamps, metal additive lamps, and arc lamps. Coherent light sources are lasers, such as xenon, argon ion, and ionized neon lasers, as well as tunable dye lasers and the frequency doubled neodymium: YAG laser.

Once the imageable element has been imaged, printing can then be carried out by applying a fountain solution and then a lithographic ink to the image on its surface. The fountain solution is taken up by the imaged regions and the ink is taken up by the unimaged regions. The ink s then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of the invention can be observed by reference to the following examples that illustrate, but do not limit, the invention.

EXAMPLES

| Glossary | |
|---|---|
| ADS-830A | Infrared absorbing dye ($\lambda_{max}$ = 830 nm)(American Dye Source, Montreal, Canada) |
| Copolymer 1 | Copolymer of N-phenylmaleimide, methacrylantide, and methacrylic acid (45:35:20 mol %) |
| Copolymer 2 | Copolymer of N-phenylmaleimide, methacrylamide, and methacrylic acid (40:35:25 mol %) |
| DOWANOL ® EPH solvent | Ethylene glycol phenyl ether (Dow Chemical, Midland, MI USA) |
| DOWANOL ® PM solvent | Propylene glycol methyl ether (Dow Chemical, Midland, MI USA) |
| HYDROPALAT ® 3204 | Dispersing agent, partially neutralized acetophosphonate amine salt (Henkel, Dusseldorf, Germany) |
| Lyncur M | Polyvinylphenol (Maruzen, Tokyo, Japan) |
| Nega 107 | Negative diazo resin derived from condensation of 3-methoxy-diphenylamine-4-diazonium sulfate and 4,4'-bis-methoxymethyldiphenylether, isolated as mesitylene sulfonate salt (Panchim, Lisses, France) |
| Novolac SPN 400 | Novolac resin (Clariant, Wiesbaden, Germany) |
| Novolac SPN 420 | Novolac resin (Clariant, Wiesbaden, Germany) |
| PD 140 | Novolac resin (Borden Chemical, Columbus, OH USA) |
| PHENODUR ® 373 resin | Phenolic resin (Vianova Resins, Wiesbaden, Germany) |
| PMP234 | Copolymer (40:50:10 wt %) of APK-234, acrylonitrile, and methacrylamide; APK-234 is a urea substituted monomer of the following structure: $CH_2{=}C(CH_3)—CO_2—CH_2CH_2—NH—CO—NH\text{-}p\text{-}C_6H_4—OH$ |
| PU Copolymer | Copolymer of N-(p-aminosulfonylphenyl)-methacrylamide, acrylonitrile, and methyl methacrylate (34/24/42 mol % = 60.5/9.3/30.2 wt %) |
| TRILON ® B chelating agent | Tetra sodium ethylenediamine tetraacetic acid (BASF, Ludwigshafen, Germany) |
| TRILON ® BS chelating agent | Ethylenediamine tetraacetic acid (BASF, Ludwigshafen, Germany) |
| Trump IR Dye | Infrared absorbing dye ($\lambda_{max}$ = 830 nm) (Eastman Kodak, Rochester, NY, USA) |

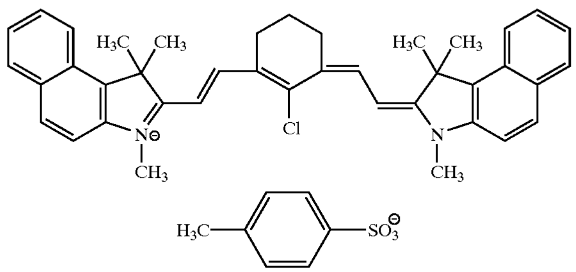

Trump IR Dye

Example 1

A coating solution was prepared by dissolving 2.13 g of a carboxy-functional polyvinylacetal prepared from maleic anhydride, 2-(N-methylamnino)-acetaldehyde dimethyl acetal, and polyvinyl alcohol following the procedure of Preparation Example 11 of Baumann, U.S. Pat. No. 5,700,619; 2.13 g of Nega 107 negative diazo resin; and 0.15 g of Trump IR Dye in 50 mL of 2-methyoxyethanol, methanol, and 2-butanone (35:25:40).

The solution was coated onto a substrate to give an ultraviolet sensitive underlayer having a coating weight of 1.40 g/m$^2$. The substrate was an aluminum sheet that had been electrochemically grained, anodized, and coated with polyvinyl phosphonic acid.

A novolac resin,(Novolac SPN 400) (2.48 g) was dissolved in 30 mL of a mixture of toluene and DOWANOL® PM solvent (70:30) and coated over the previous layer to give a top layer coating weight of 0.5 g/m$^2$. The resulting thermally imageable element was dried at 90° C. for 10 min.

Two elements were imaged with a Creo 3244 Trendsetter at 8 W and 140 rpm and developed with the negative developer 956 (pH about 10) from Kodak Polychrome Graphics. A good image with a clean background was obtained.

One of the two imaged and developed elements was flood exposed with ultraviolet radiation with a dose of 300 mJ/cm$^2$ using a SACK LCX3 5W radiation source. Each element was soaked in diacetone alcohol for 15 min. The element exposed to ultraviolet light had a weight loss of 26%, corresponding to the loss of the top layer. The element that had not been exposed to ultraviolet weight had a weight loss of 96% indicating an almost complete loss of both the top layer and the underlayer.

Example 2

Copolymer 1 (5.0 g) and IR Trump Dye (0.7 g) were dissolved in 50 mL of 2-methoxyethanol and coated onto the substrate described in Example 1 to give a coating weight of 2.0 g/m$^2$.

A novolac resin (Pd140A) (2.5 g) was dissolved in 30 mL of butyl acetate and coated over the underlayer to give a top layer with a coating weight of 0.5 g/m$^2$. The resulting thermally imageable element was dried at 90° C. for 10 min. An element was imaged and developed as described in Example 1. A good image with a clean background was obtained.

Example 3

Copolymer 2 (3.0 g), PMP 234 (1.5 g), and Trump IR dye (0.7 g) were dissolved in 50 mL of methanol/dioxolane/methyl lactate/dimethyl formamide (43:43:7:7 wt %) and coated onto the substrate described in Example 1 to give an underlayer with a coating weight of 2.0 g/m$^2$.

A novolac resin, (PHENODUR® 373 resin) (2.5 g) was dissolved in 20 mL of a mixture of butyl acetate and nz-butanol (90:10) and coated over the underlayer to give a top layer with a coating weight of 0.65 g/m$^2$. The resulting thermally imageable element was dried at 90° C. for 10 min.

An element was imaged as described in Example 1 and developed with 989 aqueous developer (pH about 10) from Kodak Polychrome Graphics. A good image with a clean background was obtained.

Example 4

Copolymer 1 (5.0 g) and IR Trump Dye (0.7 g) were dissolved in 50 mL of 2-methoxyethanol and coated onto the substrate described in Example 1 to give an underlayer with a coating weight of 2.0 g/m$^2$.

A mixture of resins (PHENODUR® 373 resin, 0.5 g, and novolac SPN 420, 2.0 g) was dissolved in 30 mL of a mixture of ethyl acetate and n-butanol (90:10) and coated over the underlayer to give a top layer with a coating weight of 0.65 g/m$^2$. The resulting thermally imageable element was dried at 90° C. for 10 min.

The element was imaged as described in Example 1 and developed with 956 aqueous developer (pH about 10) from Kodak Polychrome Graphics. A good image with a clean background was obtained. A press test, using the exposed and developed element as a printing plate, gave 100,000 good quality copies.

Example 5

A carboxy-functional polyvinylacetal (2.0 g), prepared from maleic anhydride, 2-(N-methylamino)-acetaldehyde dimethyl acetal, and polyvinyl alcohol following the procedures of Baumann, U.S. Pat. No. 5,700,619, 2-isopropylthioxanthone (0.3 g), Nega 107 negative diazo resin (0.5 g), and a 12% pigment dispersion (20 g) were dispersed in 45 mL of 2-methyoxyethanol, methanol, and 2-butanone (35:25:40) and coated onto the substrate described in Example 1 to give an underlayer with a coating weight of 1.6 g/m$^2$. The pigment dispersion was prepared by dispersing two parts of a polyvinylacetal containing maleimido groups (described in DE 198 47 616 [EP 996,037]) and one part of Paris Blue in 2-ethoxyethanol.

A novolac resin (Pd140A) (2.48 g) was dissolved in 30 mL of butyl acetate and m-butanol (90:10) and coated over the underlayer to give a top layer with a coating weight of 0.5 g/m$^2$. The resulting thermally imageable element was dried at 90° C. for 10 min.

Two elements were imaged as described in Example 1 and developed with 952 aqueous developer (pH. about 10) from Kodak Polychrome Graphics. A good image with a clean background was obtained.

One of the two imaged and developed elements was flood exposed with ultraviolet radiation as described in Example 1. Each element was soaked in diacetone alcohol for 4 min. The element exposed to ultraviolet light had a weight loss of 40%, corresponding to the loss of the top layer. The element that had not been exposed to ultraviolet light had a weight loss of about 100% indicating loss of both the top layer and the underlayer.

Example 6

Copolymer 2 (3.0 g), Nega 107 (2.13 g) negative diazo resin, and Trump IR dye (0.15 g) were dissolved in 50 mL of 2-methyoxyethanol, methanol, and 2-butanone (35:25:40) and coated onto the substrate described in Example 1 to give an underlayer with a coating weight of 1.4 g/m$^2$.

Lyncur M (2.48 g) was dissolved in 30 mL of in 30 mL of butyl acetate and n-butanol (90:10) and coated over the underlayer to give a top layer with a coating weight of 0.5 g/m$^2$. The resulting thermally imageable element was dried at 90° C. for 10 min.

Two elements were imaged as described in Example 1 and developed with 956 aqueous developer (pH about 10) from Kodak Polychrome Graphics. A good image with a clean background was obtained.

One of the two imaged and developed elements was flood exposed with ultraviolet radiation as described in Example 1. Each element was soaked in diacetone alcohol for 15 min. The element exposed to ultraviolet light had a weight loss of 26%, corresponding to the loss of the top layer. The element that had not been exposed to ultraviolet light had a weight loss of about 96% indicating an almost complete loss of both the top layer and the underlayer.

Example 7

This example illustrates use of a developer that comprises a dispersing agent. A thermally imageable element was prepared and imaged as described in Example 1. A developer containing the following components was prepared: 85 wt % water, 1 wt % HYDROPALAT® 3204 dispersing agent, 2.6 wt % sodium alkyl sulfate, 5.3 wt % sodium naphthalene sulfonate, 1.2 wt % diethanol amine, 4.0 wt % DOWANOL® EPH solvent, and 1 wt % of a buffer prepared by mixing one part of TRILON® BS and twenty parts of TRILON® B. The developer had a pH of about 10. The exposed element was developed in this developer at 24° C. in a Unigraph PC 28E processor at 80 cm/min giving a dwell time of 18 s. The developed element showed clean development with good resolution.

Example 8

This example describes the preparation of Copolymer 1. Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

If the polymerization is carried out in 1,3-dioxolane, in some cases reprecipitation can be avoided. The monomers are soluble 1,3-dioxolane, but the polymeric material is insoluble and precipitates during the reaction.

Example 9

This example describes the preparation of Copolymer 2. Following the procedure of Example 7 methacrylic acid (55.74 g), N-phenylmaleimide (181.48 g), methacrylamide (77.13 g) were heated with AIBN (0.425 g) at 60° C. with stirring for about 24 hr. Then about 5 L of methanol was added, and the precipitated copolymer filtered, washed twice with methanol, and dried in the oven at 40° C. for 2 days.

Example 10

This example illustrates preparation of a solvent resistant underlayer comprising a 75:25 by weight mixture of Copolymer 1 and a copolymer of N-(p-aminosulfonylphenyl)methacrylamide, acrylonitrile, and methyl methacrylate. Copolymer 2 (3.75 g), PU copolymer (1.25 g), and ADS-830A (0.9 g) were dissolved in 100 g of a methanol/dioxolane/methyl lactate mixture (43:43:14 wt %). The mixture was spin coated onto a lithographic substrate at a coating weight of 1.5 g/m$^2$. The substrate was an aluminum sheet that had been electrochemically grained, anodized, and coated with polyvinyl phosphonic acid.

Solvent resistance of the underlayer was measured in terms of soak loss in two different solvent mixtures. The soak loss was measured by measuring the weight change of a 1 dm$^2$ plate before soaking and after soaking for a specific time at room temperature and drying. Soak loss was calculated by dividing the weight loss by the total weight of the coating. The one-minute soak loss for the underlayer in the diacetone alcohol/water mixture was 32%. The one-minute soak loss in the 2-butoxyethanol/water mixture was 1%. The chemical resistance parameter was 0.67.

Example 11

This example illustrates formation of a solvent resistant underlayer comprising a 80:20 by weight mixture of Copolymer 2 and PMP-234. Following the procedure of Example 9, 4.0 g of Copolymer 1, 1.0 g of PMP-234, and 0.9 g of ADS-830 A were dissolved in a 100 g of a methanol/dioxolane/methyl lactate/dimethyl formamide mixture (43:43:7:7 wt %). The mixture was spin coated onto the lithographic substrate at a coating weight of 1.5 g/m$^2$.

Following the procedure of Example 9, the one-minute soak loss for the underlayer in the diacetone alcohol/water mixture was 32%. The one-minute soak loss in 2-butoxyethanol/water mixture was 1%. The chemical resistance parameter was 0.67.

Having described the invention, we now claim the following and their equivalents.

What is claimed is:

1. A method for forming an image using a thermally imageable element, the method comprising the steps of:

a) thermally imaging the thermally imageable element and producing exposed and unexposed regions in the thermally imageable element; and b) developing the thermally imageable element with an aqueous alkaline developer and removing the exposed regions;

in which:

the thermally imageable element comprises, in order:

a top layer;

an underlayer; and a hydrophilic substrate;

the underlayer comprises a first polymeric material;

the top layer comprises a second polymeric material;

the second polymeric material comprises phenolic hydroxyl groups or substituted sulphonamide groups;

the second polymeric material is removable by the aqueous alkaline developer;

the top layer is free of materials that function as a solubility-suppressing component for the second polymeric material;

the top layer is ink-receptive; and the aqueous alkaline developer has a pH of at least 7 to about 11.

2. The method of claim 1 in which the developer has a pH of about 10.

3. The method of claim 1 in which the second polymeric material is a phenolic resin.

4. The method of claim 3 in which the second polymeric material is a novolac resin, resol resin, or a mixture thereof.

5. The method of claim 4 in which the element absorbs radiation in the range of 800 nm to 1200 nm, and the element is imagewise thermally exposed with radiation in the range of 800 nm to 1200 nm.

6. The method of claim 5 in which the underlayer comprises a photothermal conversion material and the top layer is substantially free of photothermal conversion materials.

7. The method of claim 6 in which the developer has a pH of about 10.

8. The method of claim 1 in which the top layer consists essentially of the second polymeric material.

9. The method of claim 8 in which the developer has a pH of about 10.

10. The method of claim 9 in which the second polymeric material is a novolac resin, a resol resin, or a mixture thereof.

11. The method of claim 10 in which the element absorbs radiation in the range of 800 nm to 1200 nm, and the element is imagewise thermally exposed with radiation in the range of 800 nm to 1200 nm.

12. The method of claim 11 in which the underlayer comprises a photothermal conversion material and the top layer is substantially free of photothermal conversion materials.

13. The method of claim 9 in which the second polymeric material is a phenolic resin.

14. The method of claim 8 in which the first polymeric material comprises about 35 to about 60 mol % of N-phenylmaleimide; about 15 to about 40 mol % of methacryamide; and about 10 to about 30 mol % of methacrylic acid.

15. The method of claim 8 in which the first polymeric material comprises 20 to 80 wt % of one or monomers represented by the general formula:

$$CH_2{=}C(R){-}CO_2{-}CH_2CH_2{-}NH{-}CO{-}NH{-}Y{-}Z,$$

in which R is H or $CH_3$; Y is unsubstituted 1,4-phenylene; and Z is —OH, —COOH, or $SO_2NH_2$.

16. The method of claim 8 in which the first polymeric material comprises acrylonitrile or methacrylonitrile; methyl methacrylate or methyl acrylate; and a sulfonamide containing monomer unit, in which the sulfonamide containing monomer unit comprises 10 to 90 mol % of the first polymeric material.

17. The method of claim 1 in which the chemical resistance parameter for the underlayer is greater than about 0.5.

18. The method of claim 17 in which the top layer consists essentially of the second polymeric material.

19. The method of claim 18 in which the chemical resistance parameter for the underlayer is greater than about 0.6.

20. The method of claim 19 in which the developer has a pH of about 10.

21. The method of claim 1 in which the underlayer comprises a negative-working, base soluble photosensitive composition, and the method additionally comprises, after step b):

c) exposing the element with actinic radiation.

22. The method of claim 21 in which the top layer consists essentially of the second polymeric material.

23. The method of claim 22 in which the element absorbs radiation in the range of 800 nm to 1200 nm, and the element is imagewise thermally exposed with radiation in the range of 800 nm to 1200 nm.

24. A thermally imageable element comprising, in order:

a top layer;

an underlayer; and a hydrophilic substrate;

in which:

the underlayer comprises a first polymeric material;

the top layer comprises a second polymeric material;

the second polymeric material comprises phenolic hydroxyl groups or substituted sulphonamide groups;

the second polymeric material is removable by the aqueous alkaline developer;

the top layer is free of materials that function as a solubility-suppressing component for the second polymeric material; and the top layer is ink-receptive.

25. The element of claim 24 in which the second polymeric material is a phenolic resin, a resol resin, or a mixture thereof.

26. The element of claim 25 in which the element absorbs radiation in the range of 800 nm to 1200.

27. The element of claim 26 in which the underlayer comprises a photothermal conversion material and the top layer is substantially free of photothermal conversion materials.

28. The element of claim 24 in which the top layer consists essentially of the second polymeric material.

29. The element of claim 28 in which the second polymeric material is a phenolic resin.

30. The element of claim 28 in which the second polymeric material is a novolac resin, a resol resin, or a mixture thereof.

31. The element of claim 30 in which the element absorbs radiation in the range of 800 nm to 1200 nm.

32. The element of claim 31 in which the underlayer comprises a photothermal conversion material.

33. The element of claim 28 in which the first polymeric material comprises about 35 to about 60 mol % of N-phenylmaleimide; about 15 to about 40 mol % of methacryamide; and about 10 to about 30 mol % of methacrylic acid.

34. The element of claim 28 in which the first polymeric material comprises 20 to 80 wt % of one or monomers represented by the general formula:

$$CH_2{=}C(R){-}CO_2{-}CH_2CH_2{-}NH{-}CO{-}NH{-}Y{-}Z,$$

in which R is H or $CH_3$; Y is unsubstituted 1,4-phenylene; and Z is —OH, —COOH, or $SO_2NH_2$.

35. The element of claim 28 in which the first polymeric material comprises acrylonitrile or methacrylonitrile; methyl methacrylate or methyl acrylate; and a sulfonamide containing monomer unit, in which the sulfonamide containing monomer unit comprises 10 to 90 mol % of the first polymeric material.

36. A method of printing, the method comprising the steps of:

a) thermally imaging a thermally imageable element and producing exposed and unexposed regions in the thermally imageable element;

b) developing the thermally imageable element with an aqueous alkaline developer and removing the exposed regions;

c) applying ink to the unexposed regions; and d) transferring the ink to a receiver;

in which:

the thermally imageable element comprises, in order:

a top layer;

an underlayer; and a hydrophilic substrate;

the underlayer comprises a first polymeric material;

the top layer comprises a second polymeric material;

the second polymeric material comprises phenolic hydroxyl groups or substituted sulphonamide groups;

the second polymeric material is removable by the aqueous alkaline developer;

the top layer is free of materials that function as a solubility-suppressing component for the second polymeric material;

the top layer is ink-receptive; and the aqueous alkaline developer has a pH of at least 7 to about 11.

37. The method of claim 36 in which the underlayer comprises a photothermal conversion material and the top layer is substantially free of photothermal conversion materials.

38. The method of claim 37 in which:

the second polymeric material is a novolac resin, a resol resin, or a mixture thereof;

the top layer consists essentially of the second polymeric material; and the underlayer has a chemical resistance parameter greater than 0.5.

* * * * *